(12) United States Patent
Coady et al.

(10) Patent No.: US 6,478,532 B1
(45) Date of Patent: Nov. 12, 2002

(54) WAFER ORIENTING AND READING MECHANISM

(75) Inventors: Matthew W. Coady, Round Rock; Hillman L. Bailey, Dripping Springs, both of TX (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/452,059

(22) Filed: Nov. 30, 1999

(51) Int. Cl.[7] .............................................. B65G 49/07
(52) U.S. Cl. ........................ 414/783; 414/936; 414/941
(58) Field of Search ........................... 198/394; 414/783, 414/936, 941

(56) References Cited

U.S. PATENT DOCUMENTS 4,775,281 A * 10/1988 Prentakis ................ 414/936 X
5,518,542 A * 5/1996 Matsukawa et al. ..... 414/941 X
5,626,456 A * 5/1997 Nishi ..................... 414/941 X

* cited by examiner

Primary Examiner—Janice L. Krizek
(74) Attorney, Agent, or Firm—O'Melveny & Myers LLP

(57) ABSTRACT

An aligner is disclosed including a buffer mechanism having a buffer paddle on which wafers may be buffered to increase the throughput of the aligner. The aligner is provided in general to identify a position of a notch, position and read the associated indicial mark and determine the radial runout of the wafer. The aligner includes a rotating support platform in the form of a chuck on which the wafers are received from the robot. A motor rotates the chuck so that the radial runout and notch of the wafer may be identified. According to the present invention, the aligner further includes a buffer mechanism having a buffer paddle and a drive mechanism for vertically translating the buffer paddle. The aligner further includes an analog sensor for determining the notch location, the radial runout and/or the position of the indicial mark on a wafer being rotated on the chuck.

15 Claims, 13 Drawing Sheets

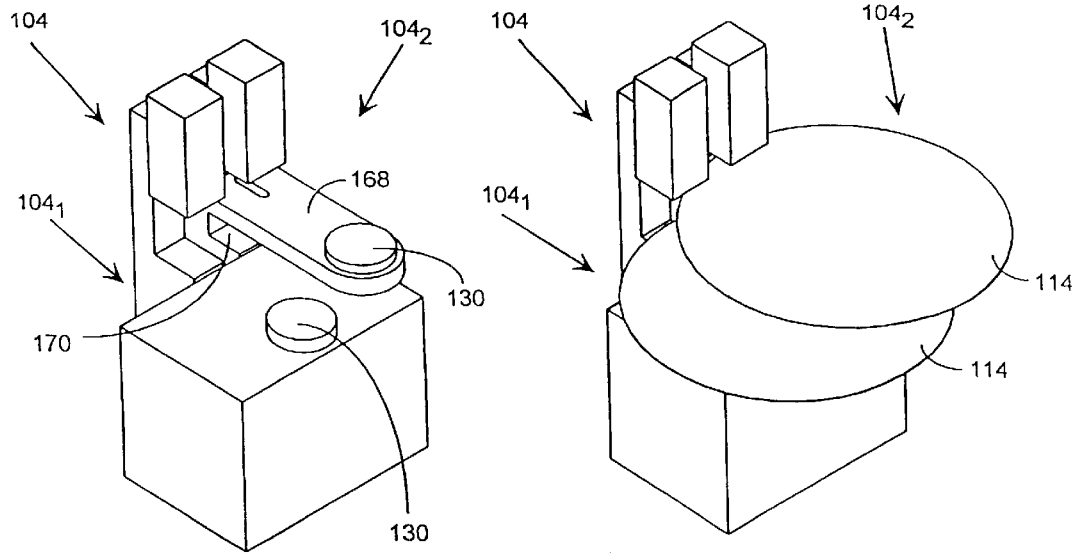
FIG. 13A
FIG. 13B
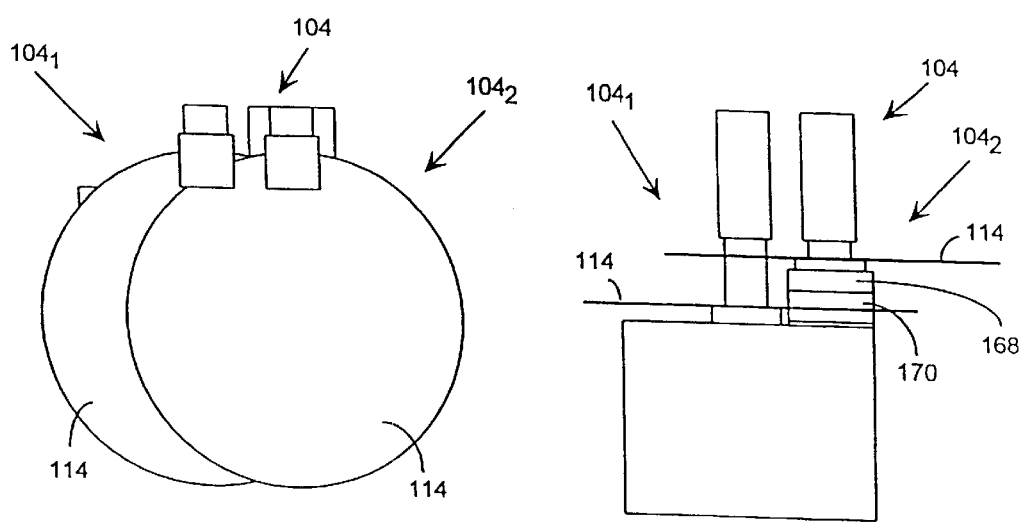
FIG. 13C
FIG. 13D

WAFER ORIENTING AND READING MECHANISM

BACKGROUND OF THE INVENTION

1. Field of the Invention

The present invention relates to semiconductor wafer handling and processing equipment, and in particular, to a device for identifying a center of a wafer and reading an OCR mark on the wafer, wherein the device includes a buffer mechanism that allows a high throughput of wafers through the device.

2. Description of the Related Art

During the fabrication of semiconductor wafers, wafers are transported between the various process tools in the wafer fab in open cassettes or cassettes sealed within a pod such as a standard mechanical interface (SMIF) pod. As wafers move through the various processing tools, it is desirable to be able to track and locate a particular wafer at any given time. Moreover, it is desirable to be able to identify a particular wafer during wafer fabrication to ensure that the wafer is subjected only to processes appropriate for that wafer. This wafer tracking is accomplished in part by marking each wafer with an optical character recognition (OCR) mark, or similar indicial mark, which mark is read for each wafer prior to locating a wafer within a processing station. The indicial mark is typically a number or letter sequence etched into an upper and/or lower surface of a wafer near the outer circumference by a laser or other suitable etching means. The indicial mark may alternatively be a bar code or a two dimensional dot matrix at an outer circumference of the wafer.

Before an indicial mark may be read, the mark must first be located. When a wafer is seated within a wafer cassette, the orientation of the wafer to the cassette, and to a tool for extracting and supporting the wafer, is generally unknown. Attempts have been made to align the indicial mark of each wafer at a particular rotational orientation within the cassette. However, because wafers move within a cassette upon handling and transfer of the cassette between processing stations, and because the wafer is often reoriented in a process tool, alignment of the indicial marks prior to transportation has not proved feasible.

In order to locate an indicial mark, wafers are conventionally formed with a fiducial mark, such as a notch or flat, on the outer edge of a wafer. For each wafer being processed, the indicial mark is located in a fixed, known relation to the notch, and by finding the notch, the precise location of the indicial mark may be determined. The notch is typically found by rotating the wafer under a sensor or camera so that the sensor or camera scans the outer edge of the wafer and identifies the radial position of the notch. Once the notch location is found, the wafer can then be rotated to position the indicial mark under a camera (the same or different than that used to find the notch), and the indicial mark may then be read.

Another reason for rotating the wafer is to determine the radial runout of the wafer. It is important that a wafer be centered when seated in the cassette or on a process tool. If a wafer is off center, it may not properly seat on a chuck of a process tool, and/or it may generate particulates by scraping against the sides of the cassette upon transfer of the wafer to the cassette. Therefore, it is desirable to determine the radial runout of the wafer and correct it to the center position. The radial runout is a vector quantity representing the magnitude and direction by which a wafer deviates from a centered position with respect to a tool on which the wafer is seated. Once the radial runout has been determined, the wafer may be moved to a center position, or the end effector of the robot may shift to acquire the wafer on center.

Conventionally, a separate operation has been devoted to locating and reading the indicial mark on the wafer, and determining and adjusting for the radial runout of the wafer, at or immediately prior to each station where it is desired to identify the particular wafers to be processed in that station. FIG. 1 shows a conventional station 20, including a module 42, typically referred to as an aligner, for performing the operation of wafer centering, notch orientation, and indicial mark reading. Such stations are conventionally located immediately upstream, as a stand alone unit, or as part of each processing station in the wafer fabrication process where the indicial mark is to be read. In addition to aligner 42, the station 20 includes a wafer handling robot 22 for accessing and transferring wafers 40 from a cassette 38. The robot 22 includes an end effector 32, and is controlled by a computer 36 such that end effector 32 transfers the wafers 40 between the cassette and the aligner 42.

The aligner 42 includes a chuck 44 capable of rotation. The robot 22 deposits the wafer on chuck 44, and the chuck then rotates the wafer to identify the location of the indicial mark and to determine the radial runout. Various digital sensors are known, such as for example digital sensor 48, for identifying the notch and determining the radial runout of the wafer. Once the position of the notch has been identified, the indicial mark may thereafter be positioned under and read by a video camera 46 also mounted on the aligner 42.

In conventional aligners, the robot must first transfer the wafer from the cassette to the aligner, the aligner then identifies the radial runout and notch position, the robot or aligner centers the wafer, and then the robot transfers the wafer back to the cassette. The robot sits idle while the aligner performs its operations, and the aligner sits idle while the robot transfers the wafers to and from the aligner. Conventional aligner/robot systems therefore have a relatively low throughput, on the order of approximately 300 wafers per hour. This low throughput is significant as the alignment process must be performed at each station where an indicial mark reading is required, and must be performed on each individual wafer at each of these stations. It is known to provide dual armed robots to increase throughput. However, such robots take up additional space within the tool and cleanroom, where space is at a premium. Moreover, the dual armed robots are expensive, require more complicated controls, and are relatively difficult to maintain.

SUMMARY OF THE INVENTION

It is therefore an advantage of the present invention to increase the throughput of wafers processed by an aligner.

It is another advantage of the present invention that the aligner does not sit idle while the robot transfers wafers to and from the aligner.

It is another advantage of the present invention that the robot does not sit idle while the aligner performs its operations.

It is a further advantage of the present invention that it does not take up additional space within the cleanroom.

It is a still further advantage of the present invention that a second wafer may be loaded onto the aligner before processing of a first wafer is complete.

It is another advantage of the present invention that conventional aligners may be easily modified at a small cost to operate in accordance with the principles of the present invention.

It is a still further advantage of the present invention to provide an improved sensor system for identifying wafer runout.

It is another advantage of the present invention that it is more economical than convention high throughput systems such as those employing duel end effector robots.

These and other advantages are provided by the present invention which in preferred embodiments relates to an aligner including a buffer mechanism having a buffer paddle on which wafers may be buffered to increase the throughput of the aligner and the system in general. The aligner according to the present invention may be seated within a minienvironment affixed to or part of a process tool, or may alternatively be provided as a standalone unit separate and apart from a process tool. In addition to the aligner, the system includes a wafer handling robot. Once a wafer-carrying cassette is loaded into the minienvironment, the robot is capable of transferring the wafers between the cassette and the aligner. The buffer mechanism allows the robot to bring a second wafer to the aligner while a first wafer is processed, and then allows the robot to carry the first wafer away from the aligner while the second wafer is processed. Thus, the aligner does not sit idle while the robot transfers wafers to and from the aligner, and the robot does not sit idle while the aligner performs its operations.

The aligner is provided in general to identify the location of a fiducial mark, such as a notch, position the associated indicial mark for reading by a camera, and determine the radial runout of the wafer. The aligner includes a rotating support platform in the form of a chuck on which the wafers are received from the robot. A motor rotates the chuck so that the radial runout and notch of the wafer may be identified. According to the present invention, the aligner further includes a buffer mechanism having a buffer paddle and a drive mechanism for vertically translating the buffer paddle. The aligner further includes an analog sensor for determining the radial runout of, and/or for identifying the position of the notch and indicial mark on, a wafer being rotated on the chuck.

In operation, a wafer is first loaded onto the chuck by the robot from the wafer cassette. After the position of the notch is identified, the indicial mark positioned and read, and the radial runout determined, the buffer paddle lifts the first wafer off the chuck. While these operations at the aligner are taking place, the robot returns to the cassette and acquires a second wafer and returns to the aligner. Thereafter, the robot deposits the second wafer on the chuck for processing, and acquires the first wafer from the buffer paddle in a centered position. The robot then returns the first wafer to the cassette, or transfers the wafer to a process tool.

After the first wafer has been carried away from the aligner, and while processing on the second wafer is taking place, the robot acquires a third wafer from the wafer cassette and returns to the aligner. At this point, the buffer paddle is positioned above the second wafer seated on the chuck. The end effector deposits the third wafer on the buffer paddle, acquires the second wafer from the chuck and removes it from the aligner. Thereafter, the buffer paddle with the third wafer thereon moves downward to deposit the third wafer on the chuck, whereupon the position of the notch is identified, the indicial mark is read, and the radial runout is determined. The aligner cycles through the above steps until each of the wafers in the cassette have been processed.

BRIEF DESCRIPTION OF THE DRAWINGS

The present invention will now be described with reference to the drawings in which:

FIGS. 10A–10C are perspective views of an aligner according to an alternative embodiment of the present invention including a horizontal drive;

FIGS. 13A–13D are views of an alternative embodiment of the present invention comprising a dual aligner configuration.

DETAILED DESCRIPTION

The present invention will now be described with reference to FIGS. 2–13D, which in general relate to an aligner including a buffer mechanism having a buffer paddle on which wafers may be buffered to increase the throughput of the aligner. The aligner according to the present invention may be seated within a minienvironment affixed to or part of a process tool, or may alternatively be provided as a standalone unit separate and apart from a process tool.

Figure 1:
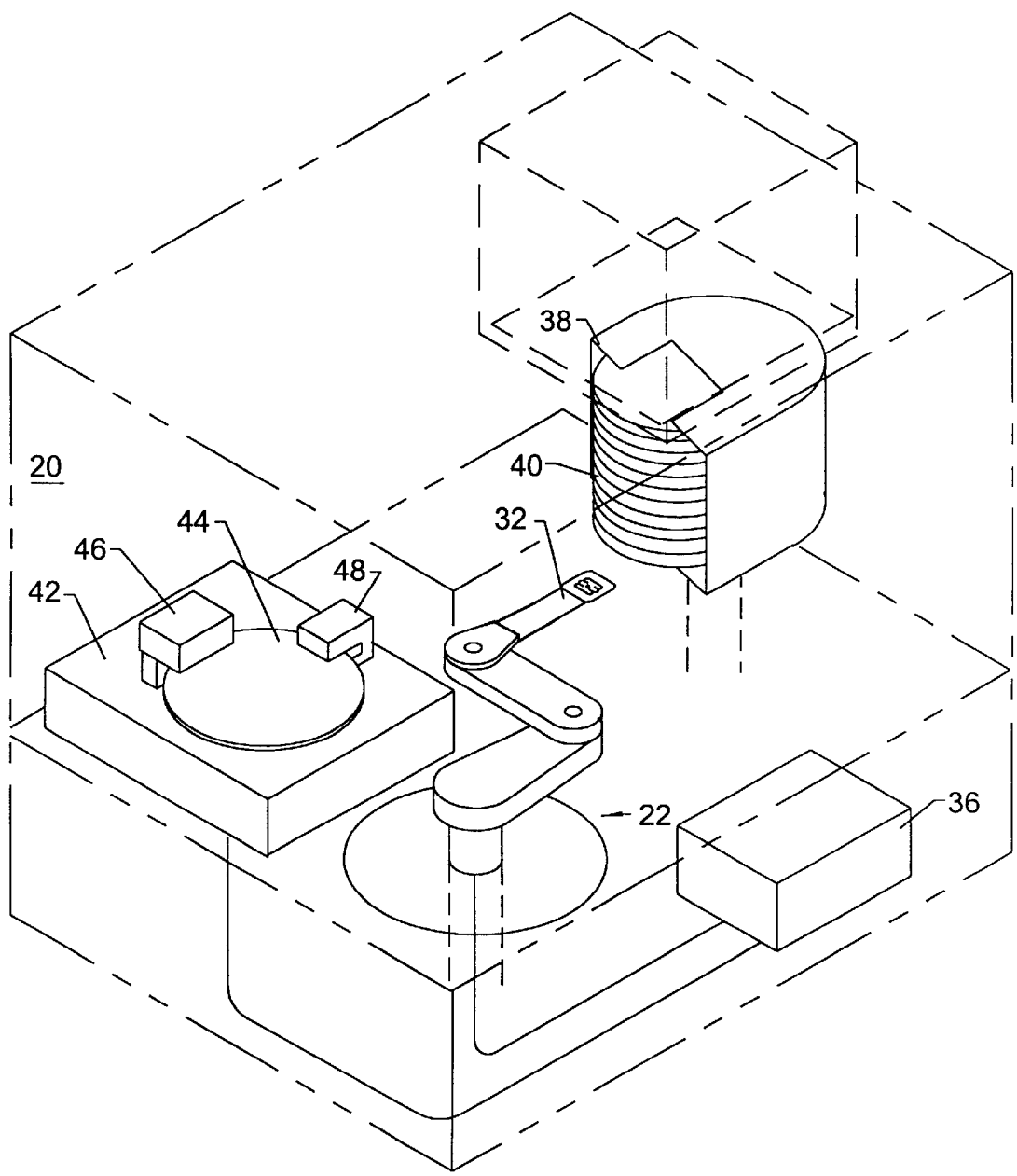
FIG. 1 is a perspective view of a prior art station including a robot and a conventional aligner.
Figure 2:
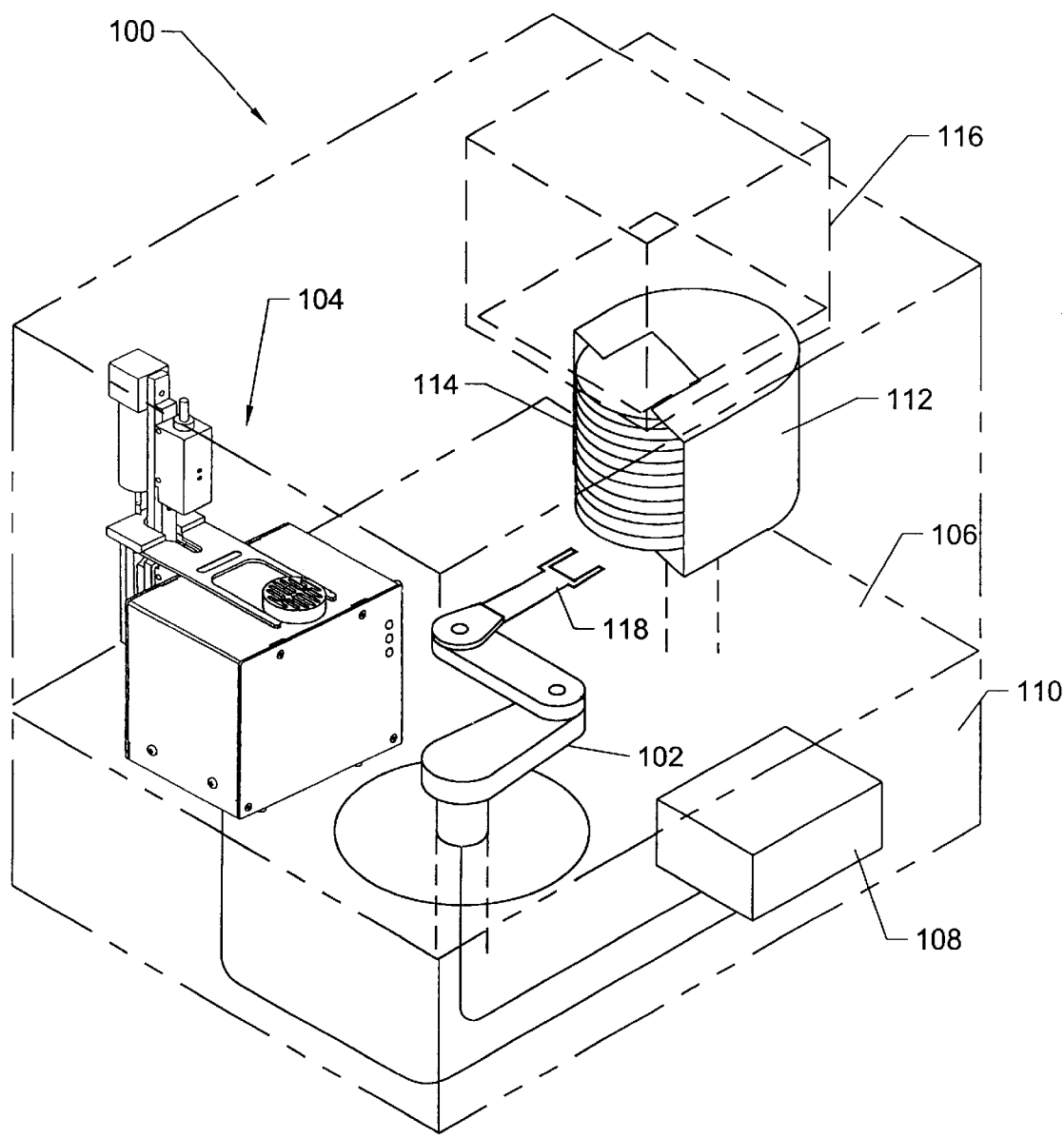
FIG. 2 is a perspective view of a minienvironment including a robot and an aligner according to the present invention.

Referring now to FIG. 2, there is shown a minienvironment 100 including a robot 102 and an aligner 104 according to the present invention seated on a base 106 of the minienvironment. A control computer 108 may be mounted within a compartment 110 below the base 106 for controlling the operation of robot 102 and aligner 104. Computer 108 may instead be located remote from the minienvironment 100 in alternative embodiments. The minienvironment is capable of accepting a cassette 112 carrying one or more workpieces such as semiconductor wafers 114. Although not critical to the present invention, cassette 112 may be loaded into the minienvironment 100 via SMIF technology or as an open cassette through a load port 116 at the top of the minienvironment. It is further contemplated that the present invention may be used with a front opening SMIF pod, in which case the robot 102 would access wafers directly from a pod shell which remains affixed to an exterior of one of the side walls of the minienvironment. Robot 102 may be a conventional pick-and-place wafer handling robot including an end effector 118 capable of transferring wafers 114 between cassette 112 and the aligner 104. It is understood that various other known wafer transfer mechanisms may be used in place of robot 102 in alternative embodiments. In a preferred embodiment, end effector 118 may be a fork-type end effector capable of supporting wafers 114 toward an outer circumference of the wafers. As will be explained in greater detail below, end effector 118 may alternatively be a blade-type end effector capable of supporting wafers 114 at a center of the wafers. As is known in the art, a low pressure may be created at the upper surface of the end effector 118 via vacuum lines connected through the robot to a remote vacuum source. The low pressure at the end effector surface ensures that wafers 114 are securely supported on the end effector. As is further known in the art, robot 102 may include one or more sensors for indicating the relative position and/or contact between the end effector and the wafer to be accessed onto the end effector.

Figure 3A:
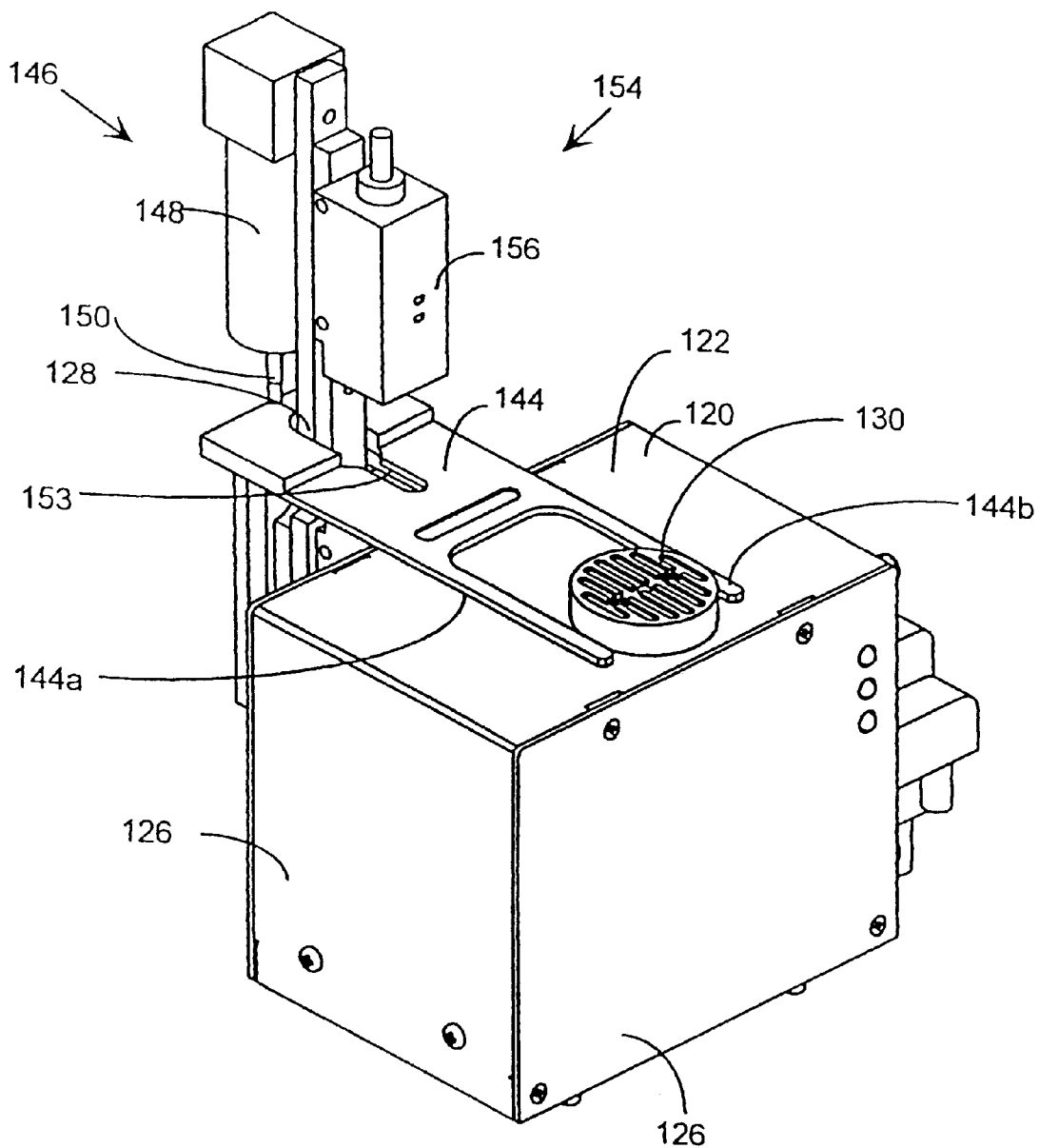
FIG. 3A is an enlarged perspective view of the aligner according to the present invention shown in FIG. 2.
Figure 3B:
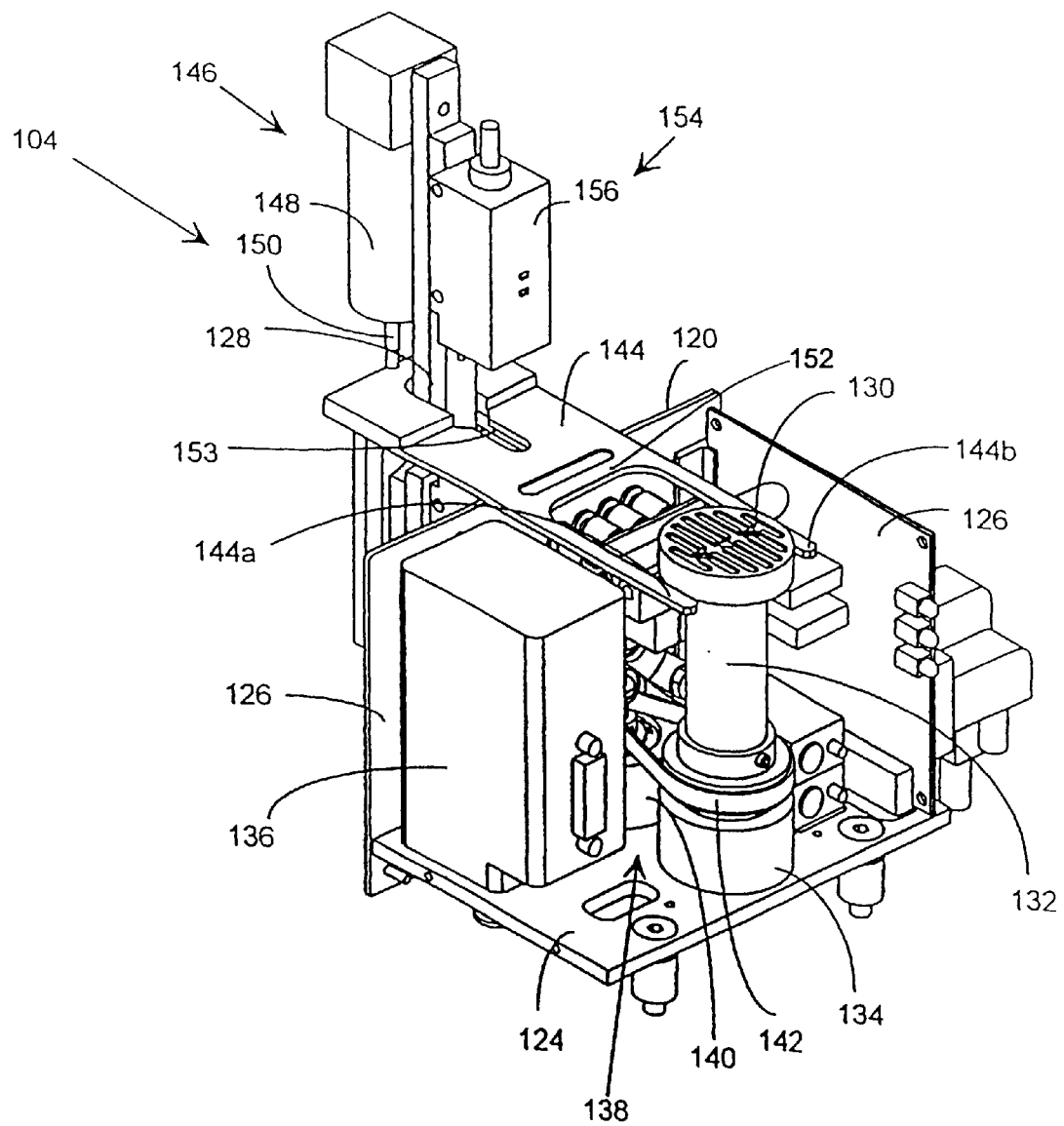
FIG. 3B is a cut away perspective view of an aligner according to the present invention shown in FIG. 3A.

Referring now to FIGS. 2, 3A and 3B, the internal components of the aligner 104 are housed within an enclosure 120 (partially removed to show the internal components in FIG. 3B), including a top 122, a base 124 and sides 126. The enclosure 120 is provided largely to prevent particulates and/or contaminants generated by the internal components from escaping into minienvironment 100. Enclosure 120 may further include a critical orifice affixed to a house vacuum source to remove particulates and contaminants from within the enclosure. The enclosure may additionally or alternatively include a fan filter unit. A stanchion 128 is mounted external to the enclosure and extends upward above top 122, the purpose of which will be explained hereinafter.

Aligner 104 further includes a chuck 130 for supporting and rotating wafers 114, which chuck includes a slotted upper surface extending above the top 122 of the enclosure 120. Chuck 130 may be seated atop a shaft 132 which is in turn rotatably coupled to a bearing assembly 134 seated on base 124. As would be appreciated by those of skill in the art, bearing assembly 134 may include bearings, such as roller or thrust bearings, to allow repeatable and precision rotation of chuck 130. Chuck 130 preferably has a diameter of approximately two inches. Thus, in loading a wafer 114 onto chuck 130, the prongs of the fork-type end effector 118 locate around the sides of chuck 130 and thereafter lower downward so that the wafer is then supported on the chuck. In a preferred embodiment, wafers 114 are preferably 200 mm wafers (approximately 8 inches) so that when seated on chuck 130, the edges of wafer 114 extend beyond the outer diameter of chuck 130 approximately 3 inches on all sides. It is understood that other sized wafers may be used in alternative embodiments, and it is also understood that the size of chuck 130 relative to wafer 114 may vary in alternative embodiments. However, in preferred embodiments, the diameter of chuck 130 is less than the diameter of wafers 114 so that a portion of the wafer extends out beyond the chuck. A low pressure is preferably generated at the slotted upper surface of the chuck via vacuum lines fed through the chuck and connected to a remote vacuum source (not shown) so that the wafers are securely held on the chuck.

In an alternative embodiment of the present invention, instead of a wafer 114 having its back surface lying in engagement with the chuck 130, two or more edge grips may be provided for gripping the wafer 114 at its edges while the wafer is seated on the aligner. According to this embodiment, each edge grip would include a surface sloping downward toward the center of a wafer seated thereon. The top portions of the respective edge grips together define a circle having a larger diameter than the diameter of the wafer so that off center wafers may be loaded onto the edge grips by the end effector. Thereafter, as the wafer lowers to a secure position in engagement with each of the edge grips, the respective sloping surfaces will tend to correct any off center position of the wafer. The edge grips are preferably formed of carbon fibre filled polyetheretherkeytone (PEEK) or some other low friction material to minimize the generation of particulates.

A motor 136 is provided within the enclosure 120 for generating the torque for rotating chuck 130. Although not critical to the present invention, motor 136 is preferably a brushless type servo motor. It is understood that other motor configurations may be used in alternative embodiments, such as for example a stepper motor. Torque from motor 136 is transmitted to chuck 130 via a torque transmission system 138. As would be appreciated by those of skill in the art, torque transmission system 138 may include various known torque transmission mechanisms such as gears, belts and direct drives. In one embodiment of the system 138, motor 136 includes an output shaft coupled to an intermediate torque transmission mechanism 140 via a first belt (not shown).

The torque imparted to the intermediate torque transmission mechanism 140 is in turn transferred to chuck 130 via a belt 142 having a first end wrapped around a shaft of the intermediate torque transmission mechanism 140 and a second end wrapped around a portion of shaft 132 of chuck 130. The diameter of the portion of the shaft 132 around which the belt 142 is wrapped is preferably larger than the diameter of the portion of the intermediate torque transmission mechanism around which the opposite end of the belt is wrapped. This allows for a velocity reduction and high precision rotational control of the chuck 130. The rotation of the motor 136 is controlled by the computer 108 to rotate the chuck 130 as desired.

It is understood that the relative diameters of the respective shafts around which belt 142 is wrapped may vary in alternative embodiments. It is further understood that alternative torque transmission mechanisms, such as a plurality of gears, may be provided in place of belt 142 to transmit torque. Additionally, it is understood that intermediate torque transmission mechanism 140 may be omitted and that torque from motor 136 may be imparted directly to chuck 130 in alternative embodiments.

According to the present invention, the aligner 104 further includes a buffer paddle 144 for supporting a wafer while another wafer is supported on chuck 130. In a preferred embodiment, buffer paddle 144 is translatably mounted to stanchion 128 by a drive 146 mounted on the stanchion. In a preferred embodiment, drive 146 may comprise a pneumatic cylinder 148 having a translating output shaft 150 to which buffer paddle 144 is fixedly attached. As would be appreciated by those of skill in the art, drive 146 could be other types of drives such as a linear lead screw drive or a solenoid. In a preferred embodiment, drive 146 imparts a vertical stroke of between approximately one-quarter inch and one inch, and optimally about one-half inch, to the buffer paddle 144.

The buffer paddle preferably includes a slot 153 through which the stanchion 128 and an analog sensor system (described hereinafter) are seated. In a preferred embodiment, buffer paddle 144 has a width slightly greater than that of chuck 130, and has an end 152 including fingers 144a and 144b fitting on either side of the chuck 130. The end 152 may alternatively include one or more slots (not shown) so that a low pressure may be generated at end 152 via vacuum lines fed through the buffer paddle 144 which connect to a remote vacuum source. In this embodiment, fingers 144a and 144b may be omitted. The wafer is instead supported on the buffer paddle 144 as a result of a suction created between the end 152 of the paddle and an edge of the wafer extending out beyond the chuck 130.

In its lowermost position, buffer paddle 144 is located at an elevation below the upper surface of chuck 130. The drive 146 is capable of moving the buffer paddle 144 upward from its lowermost position to engage a portion of a wafer 114 extending out beyond the outer diameter of chuck 130 and to thereafter lift the wafer 114 up off chuck 130. The wafer is held securely on buffer paddle 144 on fingers 144a and 144b, or by the low pressure created at the end 152 of buffer paddle 144 in the alternative embodiment. The drive 146 is also capable of moving the buffer paddle 144 downward from its uppermost position to deposit a wafer onto chuck 130. The upward and downward movement of buffer paddle 144 by drive 146 is controlled by computer 108.

Figure 3C:
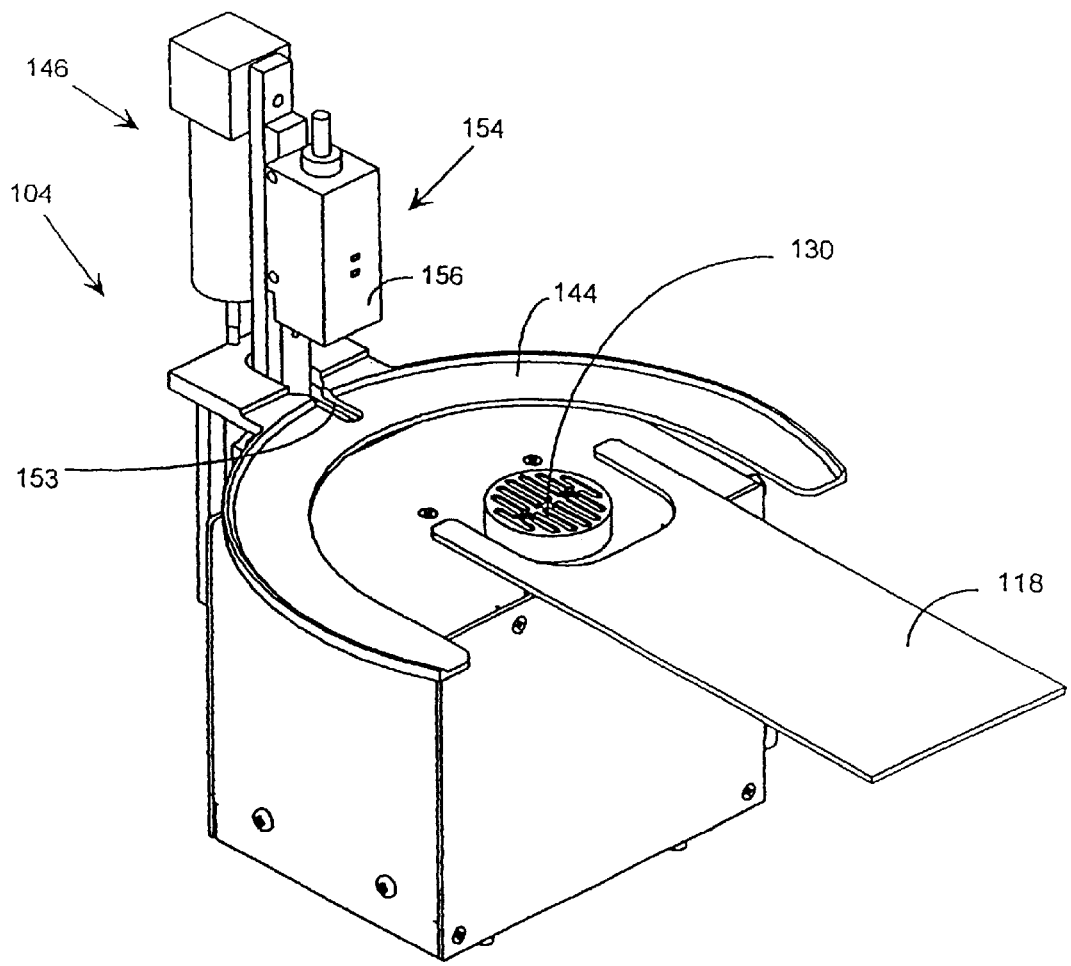
FIG. 3C is a perspective view of an aligner according to an alternative embodiment of the present invention.

In a preferred embodiment, buffer paddle 144 comprises a relatively thin and long member. However, it is understood that the buffer paddle 144 may have other shapes in alternative embodiments. For example, the buffer paddle 144 may be semicircular, as shown in FIG. 3C, to engage a greater portion of the wafer protruding past the outer circumference of the chuck. Other buffer paddle shapes are also contemplated.

Referring now to FIGS. 2–6, aligner 104 further includes an analog sensor system 154 for determining the radial runout of a wafer seated on chuck 130, and for locating a fiducial mark, such as a notch, conventionally formed in wafers 114. Analog sensor system 154 preferably includes a transmitter 156 securely mounted to a side of stanchion 128 opposite to that supporting the drive 146. The transmitter is preferably mounted at an elevation above the uppermost height of buffer paddle 144. Transmitter 156 preferably comprises a laser for transmitting a narrow linear pattern of light 157 downward toward an outer edge of a wafer 114 seated on chuck 130. The linear light pattern emitted from transmitter 156 is preferably about 1 cm long and is oriented substantially along a radial out from a center of the chuck. The linear light pattern is also substantially parallel to a direction of movement of the end effector 118 as it drops off and picks up wafers. In a preferred embodiment, the light emitted from the transmitter may be frequency modulated to prevent interference by ambient light.

The analog sensor system 154 preferably further includes a receiver 158 located directly below transmitter 156 at an elevation below the lowermost position of buffer paddle 144. Receiver 158 is provided for receiving the linear light pattern emitted from the transmitter and measuring the intensity of the portion of the light received therein. Slot 153 is provided in buffer paddle 144 to allow the linear light pattern from transmitter 156 to pass through the buffer paddle 144 to receiver 158. It is understood that the analog sensor system 154 may be located in a position away from the buffer paddle 144 (i.e., not parallel to a direction of movement of the end effector 118) so that slot 153 through paddle 144 may be omitted.

Figure 4:
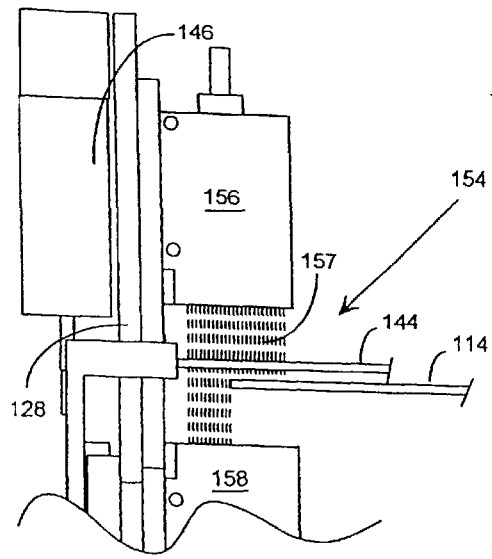
FIG. 4 is a schematic side view illustrating the analog sensor system according to the present invention with a wafer centered on the chuck to provide a median level of light intensity in the receiver of the sensor.
Figure 5:
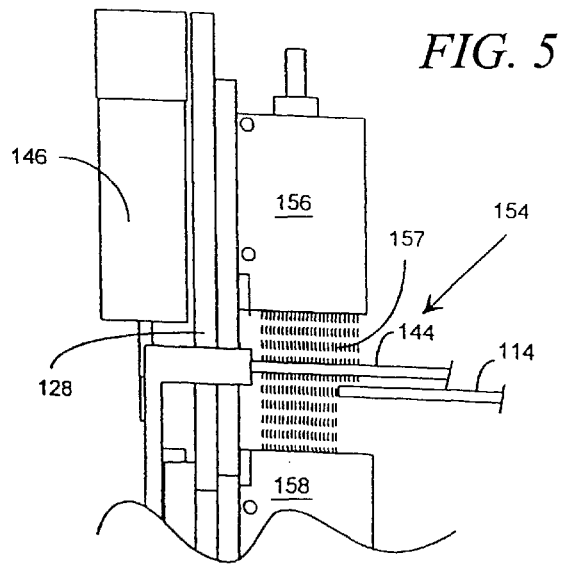
FIG. 5 is a schematic side view of the analog sensor system according to the present invention with the wafer offset from center to provide a maximum level of light intensity received within the receiver of the sensor.
Figure 6:
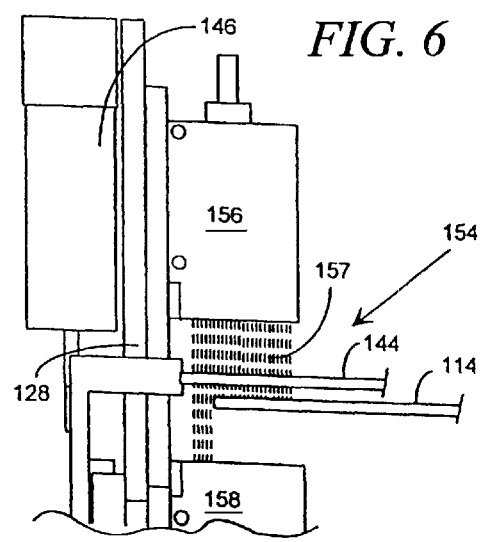
FIG. 6 is a schematic side view of the analog sensor system according to the present invention with the wafer offset from center to provide a minimum level of light intensity received within the receiver of the sensor.

As shown in FIGS. 4–6, the linear light pattern from transmitter 154 is positioned so that a wafer seated on chuck 130 will intercept a portion of the light pattern and prevent that portion from being received within receiver 158. As the wafer is likely off center when seated on chuck 130, the amount of the light pattern blocked by the wafer will vary as the wafer rotates. The light pattern from transmitter 154 is sufficiently long so that the wafer will block a portion of the light pattern even for a significant off center position of the wafer on the chuck. The varying amounts of light intensity received within the receiver are measured and stored within computer 108 as numerical values. In a preferred embodiment, a centered wafer will block approximately one-half of the light pattern from transmitter 154, as shown in FIG. 4, resulting in a median light intensity as measured by receiver 158.

By rotating the chuck 130 through 180°, the orientation of the wafer which results in a maximum intensity above the median intensity being received in the receiver 158 represents a position of maximum radial runout (FIG. 5). Alternatively, if there is no maximum intensity above the median intensity, the orientation of the wafer which results in a minimum light intensity below the median intensity being received in the receiver 158 represents the position of minimum radial runout (FIG. 6). A maximum intensity above the median intensity will indicate that the wafer needs to be shifted in one direction (i.e. to the left in FIG. 5) to center the wafer, and a minimum intensity below the median intensity will indicate that the wafer needs to be shifted in the opposite direction (i.e. to the right in FIG. 6) to center the wafer. In an alternative embodiment, the wafer may be rotated through 360° to identify the rotational positions at which the maximum and minimum light intensities are received within receiver 158. These rotational positions will of course be offset 180° from each other.

Upon rotation of the wafer on the chuck, the analog sensor system 154 is also capable of identifying the position of the notch formed in the wafer, so that the position of the OCR mark on the wafer may be identified. It may be necessary to rotate the wafer as much as approximately 360° to find the wafer notch. Once the position of the OCR mark is identified, the wafer is further rotated to position the OCR mark under a camera, such as a charge coupled display (CCD) camera, so that the mark may be read. In an alternative embodiment, the analog sensor system 154 may be omitted, and the camera used to read the indicial mark may also be used to find the notch and to determine the radial runout of the wafer. As would be appreciated by those of skill in the art, in such an embodiment, it may be necessary to refocus and/or zoom in the camera to read the indicial mark after the camera determines the notch location and radial runout.

It is contemplated that the operation to determine the position of the notch may occur at the same time as the process for determining the radial runout of the wafer. However, in alternative embodiments, a separate rotation of the wafer may be carried out to determine the radial runout before or after rotation of the wafer to identify the notch.

Once the magnitude and angular orientation of the maximum radial runout have been determined, the computer 108 is able to position the end effector under the center of the wafer so as to acquire the wafer on center from either the chuck 130 or buffer paddle 144 (as explained hereinafter). In an alternative embodiment, in addition to rotation, the chuck is also capable of translation. An aligner including a chuck capable of both rotation and translation to reposition a wafer along the axis of rotation of the chuck is known and is disclosed for example in U.S. patent application Ser. No. 09/162,334, now U.S. Pat. No. 6,298,280, entitled, "Method and Apparatus For Orienting a Wafer", by Bonora et al., which application is assigned to the owner of the present invention and which application is incorporated by reference in its entirety herein. As disclosed in that reference, after the center of the wafer is identified, pins mounted independently of the rotating chuck raise the wafer off the chuck, the chuck translates to center the wafer on the chuck, and the pins lower the wafer back onto the chuck. Such pins could be incorporated into the enclosure top 122 of the present invention. In an embodiment of the present invention using such pins, the end effector may comprise a blade as opposed to fork-type prongs.

In a further alternative embodiment, instead of repositioning the wafer or end effector to a centered position with respect to each other, the buffer paddle 144 may include chamfered edges. According to this alternative embodiment, when the buffer paddle acquires a wafer as explained below, the chamfered edges cause the wafer to settle into a centered position on the buffer paddle. Thereafter, the end effector may simply acquire the wafer (from either the buffer paddle or chuck as explained hereinafter) by extending to the preprogrammed position at which the end effector expects to find a centered wafer.

In another alternative embodiment, instead of repositioning the wafer or end effector to a centered position with respect to each other, after the maximum radial runout is determined, the wafer may be rotated so that the vector position of maximum radial runout faces the robot. That is, the vector position of maximum radial runout is oriented along the axis of translation of the end effector. In this embodiment, the end effector then acquires the wafer by extending to the preprogrammed position at which the end effector expects to find a centered wafer. Once acquired, the wafer will be centered on the end effector side-to-side (i.e., in a direction transverse to the direction of extension of the end effector), but may be off centered on the end effector front-to-back (i.e., in a direction along the direction of extension of the end effector). In this embodiment, the end effector will return the wafer to the wafer cassette without contacting the sides of the wafer cassette, but the wafer may be slightly misaligned front-to-back in the cassette. This misalignment is corrected by conventional mechanisms within a pod in which the wafer cassette is subsequently returned. In particular, in both front opening and bottom opening pods, wafer retention devices are included for aligning and securing the wafers in the cassette in a fixed and proper front-to-back position. One such system is disclosed in U.S. Pat. No. 4,815,912, entitled, "Box Door Actuated Retainer", by Maney et al., which Patent is assigned to the owner of the present invention and which Patent is incorporated by reference in its entirety herein.

In a further embodiment of the present invention, the analog sensor system 154 may be used to adjust the position of the wafer in one direction to minimize radial runout as the wafer is loaded onto the chuck or buffer paddle as explained hereinafter from the end effector. In this embodiment, when the wafer is loaded onto the chuck or buffer paddle, it will block a portion of the linear light pattern transmitted by transmitter 156. As explained above, the light transmitted by the transmitter 156 is oriented parallel to the direction of movement of the end effector, and a wafer which is centered front-to-back on the end effector will block a known percentage of the light pattern from transmitter 156. If more than the expected amount of light is blocked as the wafer is loaded from the end effector, then it is known that the wafer is too far forward on the end effector. In this event, the end effector may retreat until the proper amount of light is blocked, at which point the wafer is centered front-to-back over the chuck or buffer paddle. The wafer may then be transferred onto the chuck or buffer paddle. Similarly, if less than the expected amount of light is blocked as the wafer is loaded from the end effector, then it is known that the wafer is too far back on the end effector. In this event, the end effector may extend forward until the proper amount of light is blocked, at which point the wafer is centered front-to-back over the chuck or buffer paddle. The wafer may then be transferred onto the chuck or buffer paddle. Thereafter, the radial runout operations will still need to be performed to determine any radial runout resulting from a side-to-side off center position of the wafer.

Figure 7A:
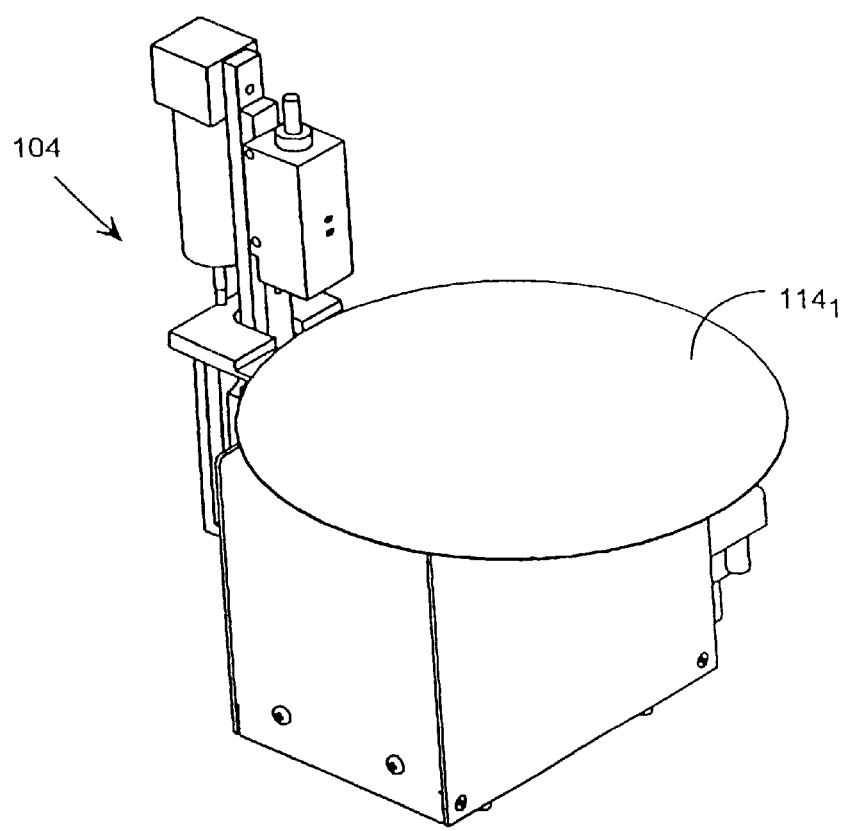
FIG. 7A is a perspective view of the aligner showing a wafer seated on the chuck and a buffer paddle positioned below the wafer.
Figure 7B:
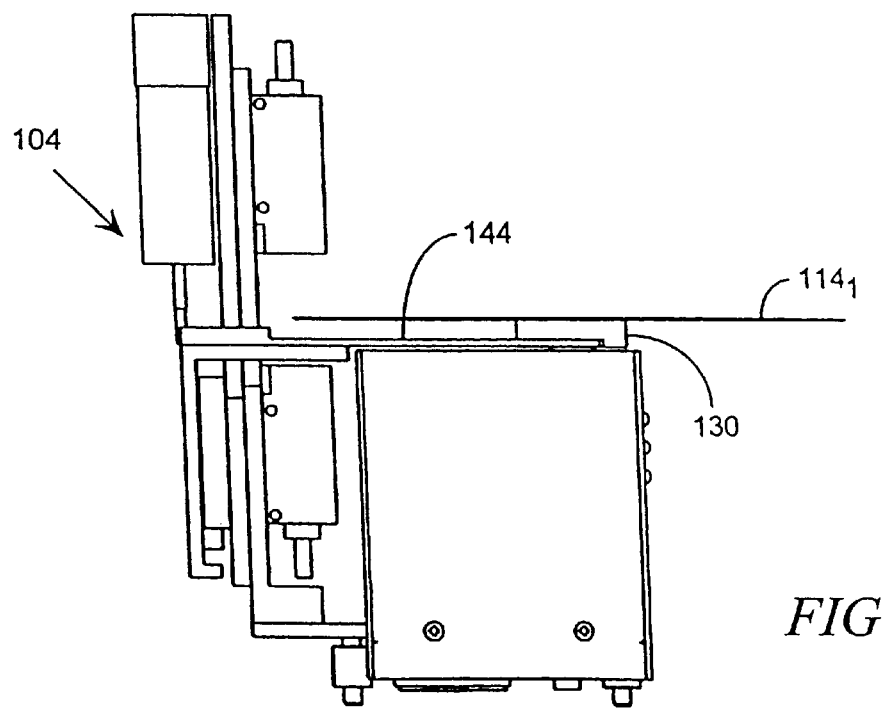
FIG. 7B is a side view of the aligner shown in FIG. 7A.
Figure 8A:
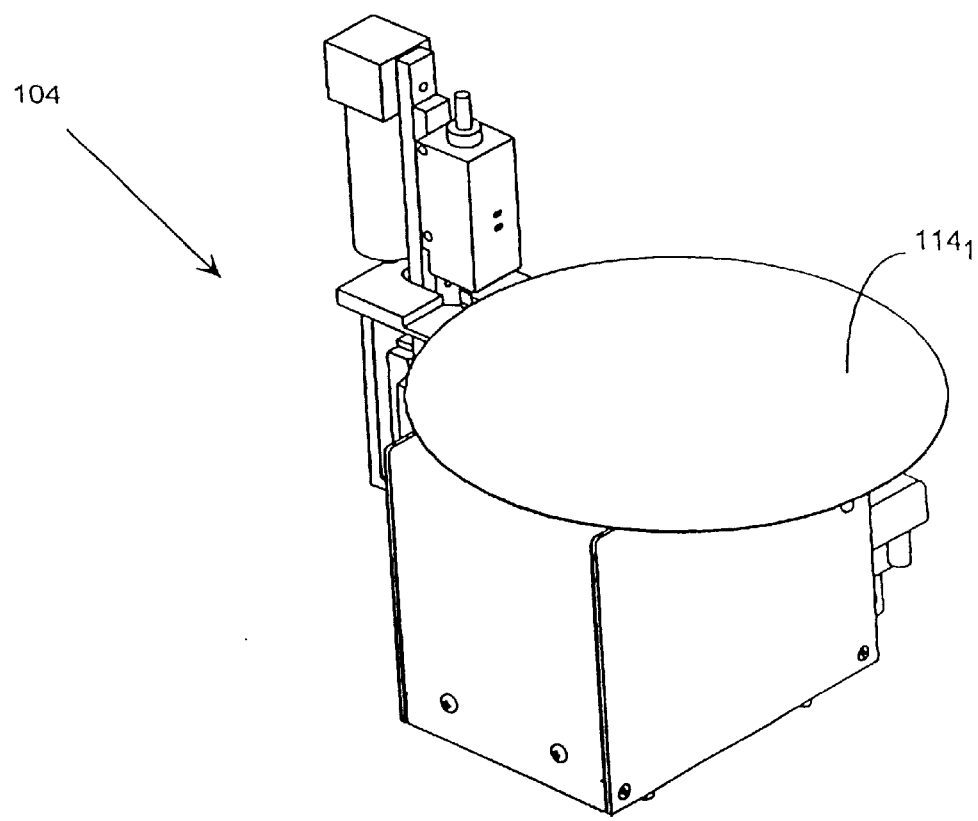
FIG. 8A is a perspective view of the aligner showing the buffer paddle moved upward and the wafer seated on the buffer paddle.
Figure 8B:
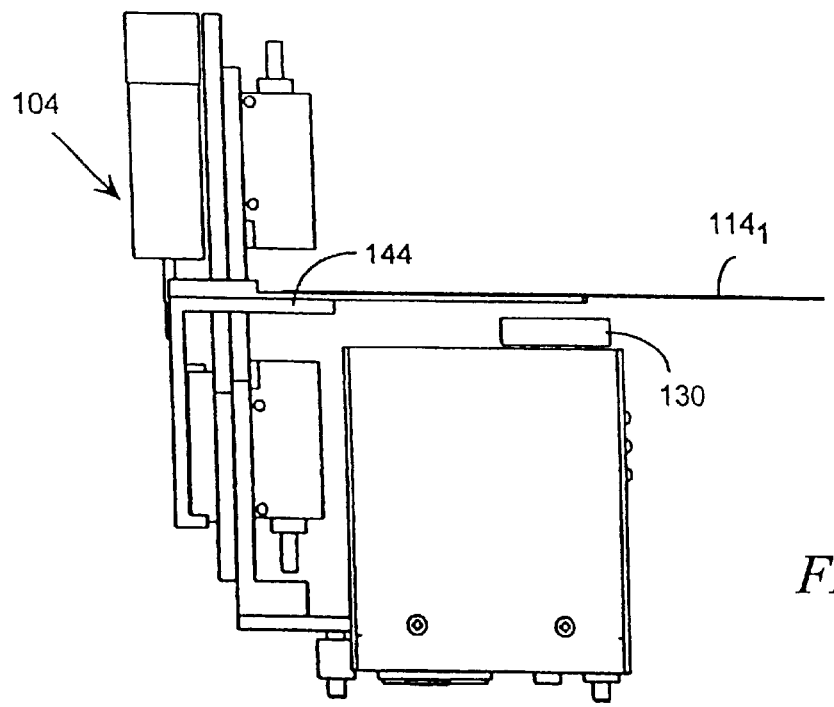
FIG. 8B is a side view of the aligner shown in FIG. 8A.

The operation of the present invention will now be described with reference to FIGS. 2 and 7A–12B. Initially, a first wafer $114_1$ is transferred by robot 102 from the cassette 112 onto the chuck 130. At this point, as shown in FIGS. 7A and 7B, the buffer paddle 144 is positioned at its lowermost elevation below the wafer $114_1$. Thereafter, the above-described operations for identifying the notch location, reading the indicial mark, and determining the radial runout of wafer $114_1$ are carried out. Once these operations are completed, the buffer paddle 144 moves upward and lifts the wafer $114_1$ up off chuck 130 as shown in FIGS. 8A and 8B and as described above.

Figure 9A:
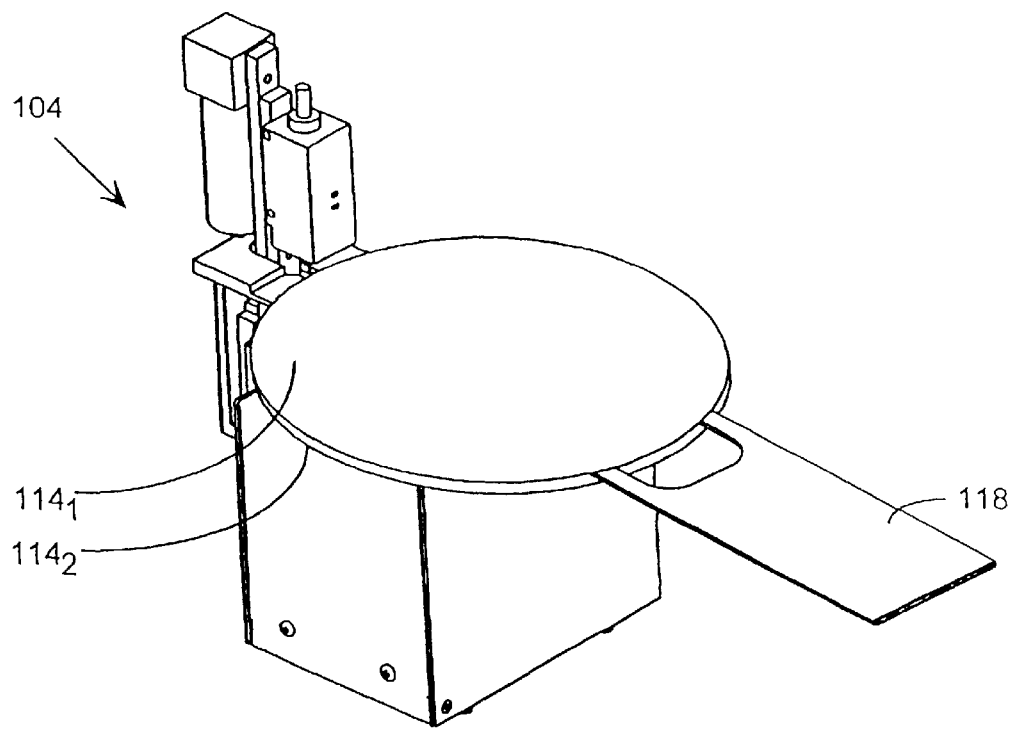
FIG. 9A is a perspective view of the aligner showing a first wafer seated on the chuck, with the buffer paddle positioned above the first wafer, and a second wafer being removed from the buffer paddle on the end effector.
Figure 9B:
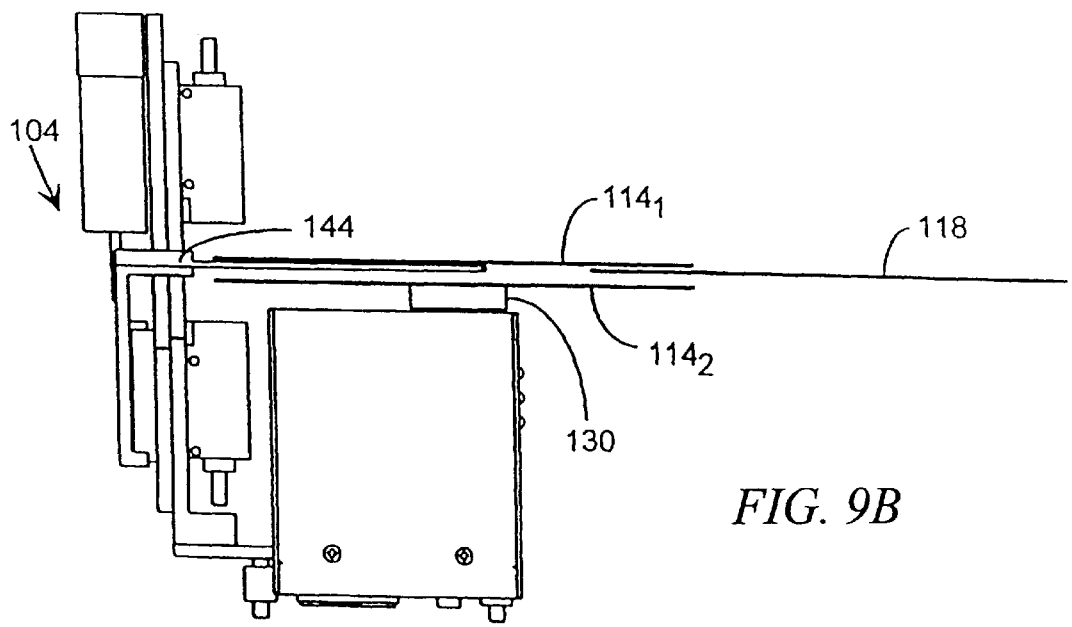
FIG. 9B is a side view of the aligner shown in FIG. 9A.

While these operations at the aligner 104 are taking place, the robot 102 returns to the cassette 112 and acquires a second wafer $114_2$ (FIGS. 9A and 9B) and returns to the aligner. The timing of the operations at the aligner and the wafer acquisition by the robot are such that the robot returns to the aligner with the second wafer $114_2$ at approximately the same time as buffer paddle 144 lifts the wafer $114_1$ up off the chuck 130. Thereafter, the robot 102 deposits the wafer $114_2$ on the chuck 130 via end effector 118, withdraws sufficiently to clear the wafer $114_2$, raises upward above wafer $114_2$, and then moves under and acquires the processed wafer $114_1$ from the buffer paddle 144. This position of the aligner is shown in FIGS. 9A and 9B. As previously discussed, as the center of wafer $114_1$ has been identified, the end effector can pick up the wafer $114_1$ from the buffer paddle on center. The end effector then returns the wafer $114_1$ to the cassette 112, or transfers the wafer to the process tool. It is understood that the spacing between the fingers on the buffer paddle may be different than the spacing between the fingers on the end effector so that these components do not interfere with each other as the end effector acquires the wafer from the buffer paddle.

In a preferred embodiment, processing of the second wafer $114_2$ seated on chuck 130 does not begin until the end effector 118 carries the first wafer $114_1$ away from the buffer paddle 144. This is so because first wafer $114_1$ on buffer paddle 144 may block the light 157 of the analog sensor system 154 and thereby prevent the radial runout determination, notch finding and OCR mark reading for the new wafer $114_2$ on the chuck.

Figure 10C:
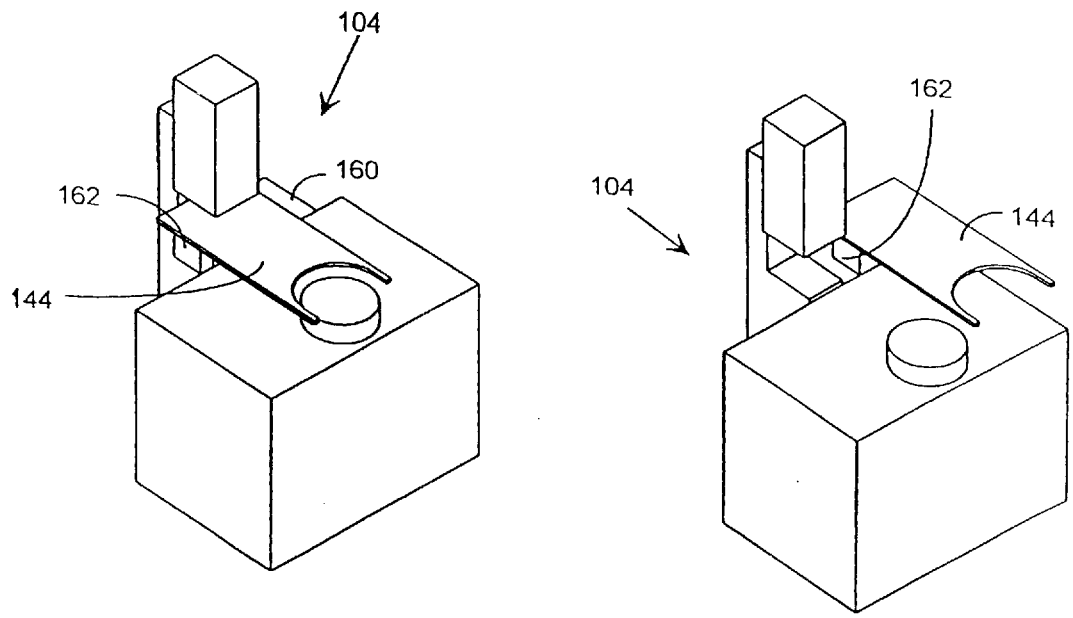

However, in an alternative embodiment of the invention, in addition to the above-described vertical stroke of buffer paddle 144, buffer paddle 144 may also be mounted for horizontal movement. This alternative embodiment is shown in FIGS. 10A–10C. Horizontal movement of the buffer paddle 144 from the position shown in FIG. 10A to the position shown in FIG. 10B is accomplished by a horizontal drive 160 (shown schematically) affixed to a back of the aligner 104. The drive can include a carriage 162 to which the buffer paddle 144 is affixed. The carriage 162 maybe driven be laterally by a motor or solenoid for example, which motor or solenoid is controlled by the computer 108. As would be appreciated by those of skill in the art, other drive mechanisms may be employed for moving the buffer paddle 144 laterally. In the embodiment shown in FIGS. 10A–10C, at some point before or after the location of the second wafer $114_2$ on chuck 130, the buffer paddle 144 with wafer $114_1$ supported thereon, advances to the right as shown in FIG. 10C. The horizontal motion need be no more than approximately one-half inch. Advanced to the position shown in FIG. 10C, the processed wafer $114_1$ can no longer interfere with the operations of the analog sensor system 154 on the new wafer $114_2$. Thus, the notch finding, indicial mark reading and radial runout determination operations on wafer $114_2$ may take place before the end effector removes the processed wafer $114_1$ from the buffer paddle 144.

Figure 10C:
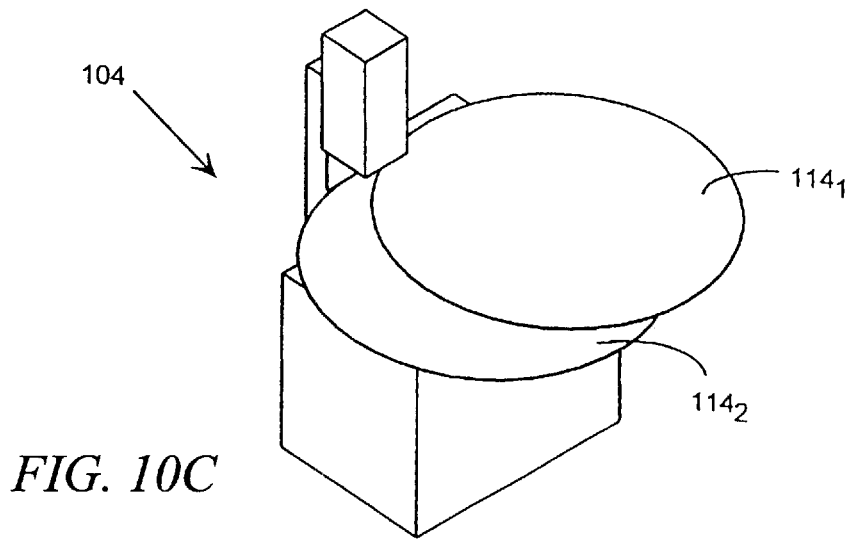

As would be appreciated by those of skill in the art, buffer paddle 144 may be mounted for such horizontal movement by several known drive mechanisms, such as for example those included as part of drive mechanism 146 described above for imparting the vertical stroke to buffer paddle 144. In the embodiment of FIG. 10, the motion of the end effector must be controlled to compensate for the horizontal movement of the buffer paddle so that, after the horizontal translation of the buffer paddle 144, end effector 118 still acquires the wafer $114_1$ on center. The computer 108 both controls the horizontal movement of the buffer paddle 144, and controls the end effector to compensate for such horizontal motion of the buffer paddle.

Figure 11A:
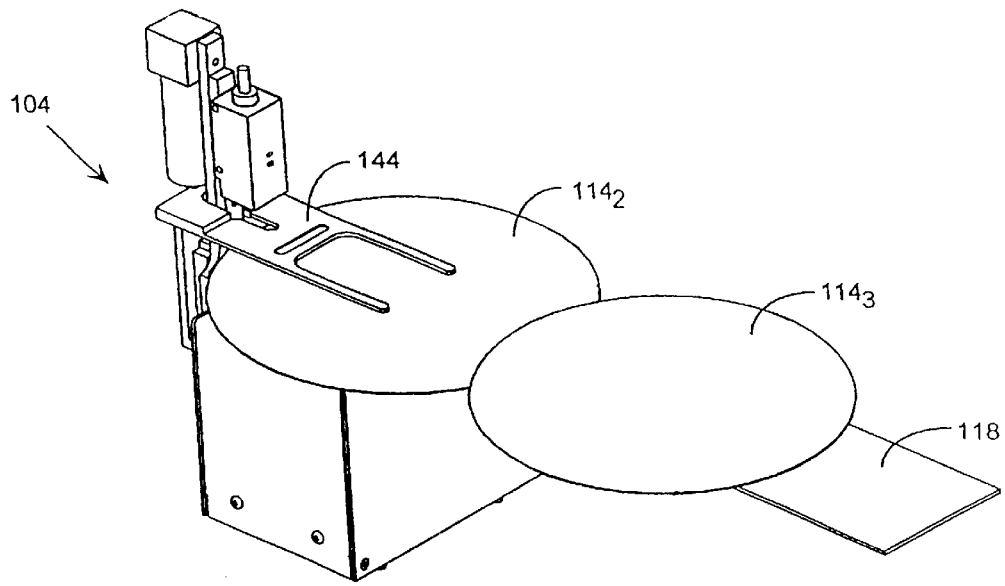
FIG. 11A is a perspective view of the aligner showing a wafer seated on a chuck with the buffer paddle located above the wafer and an end effector bringing a new wafer for positioning on the buffer paddle.
Figure 11B:
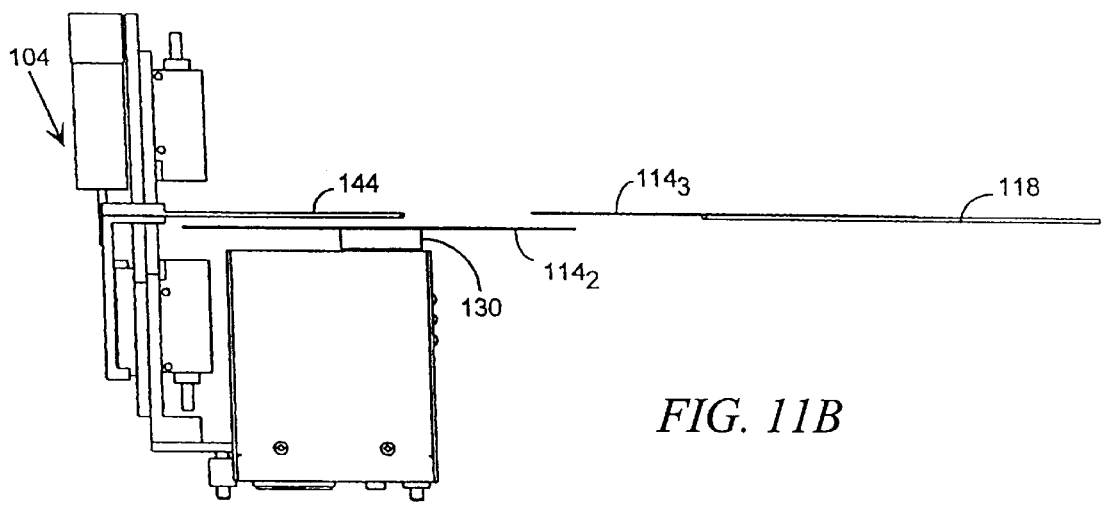
FIG. 11B is a side view of the aligner shown in FIG. 11A.

Returning to the embodiment of FIGS. 9A and 9B, after the first wafer $114_1$ has been carried away from the aligner 104, and while processing on the second wafer $114_2$ is taking place, the robot 102 acquires a third wafer $114_3$ and returns to the aligner. At this point, as shown in FIGS. 11A and 11B, the buffer paddle 144 is positioned above the wafer $114_2$ seated on chuck 130. The end effector 118 deposits the new wafer $114_3$ on the buffer paddle 144, withdraws sufficiently to clear the outer edge of the wafer $114_2$, and then moves downward and in under wafer $114_2$ to acquire the processed wafer $114_2$ and remove it from the aligner 104. Thereafter, the buffer paddle 144 with wafer $114_3$ thereon moves downward to deposit the wafer $114_3$ on chuck 130 as shown in FIGS. 12A and 12B, whereupon the notch find, indicial mark read and radial runout determination operations on wafer $114_3$ take place.

Figure 12A:
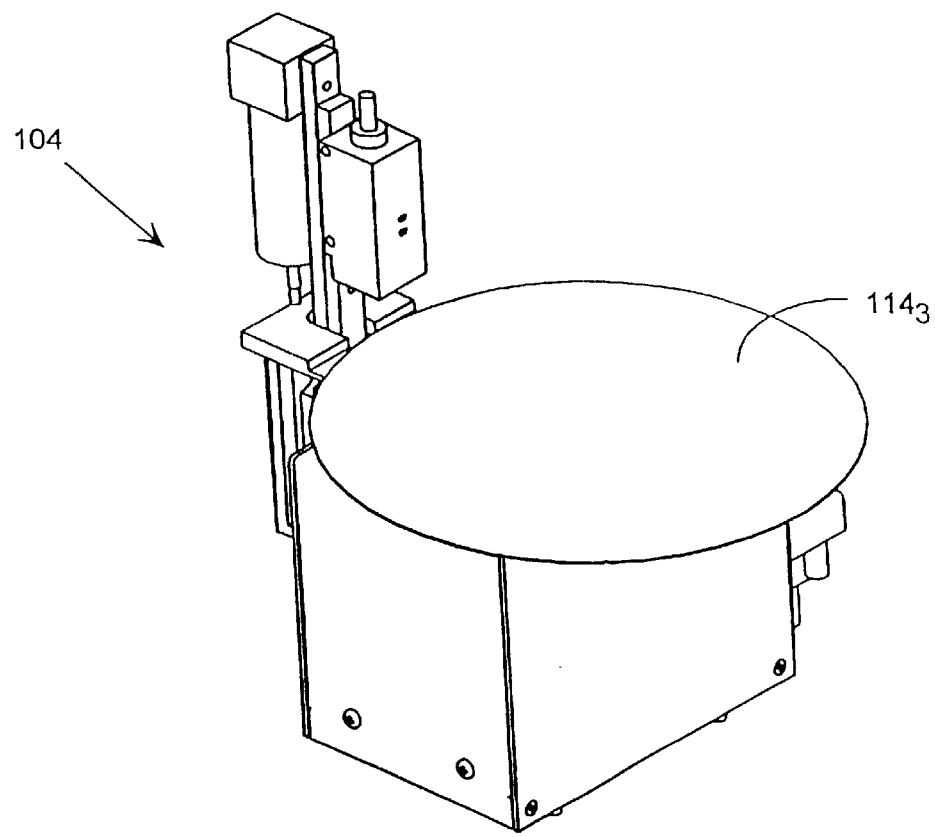
FIG. 12A is a perspective view of the aligner showing a wafer seated on the chuck and the buffer paddle located below the wafer.
Figure 12B:
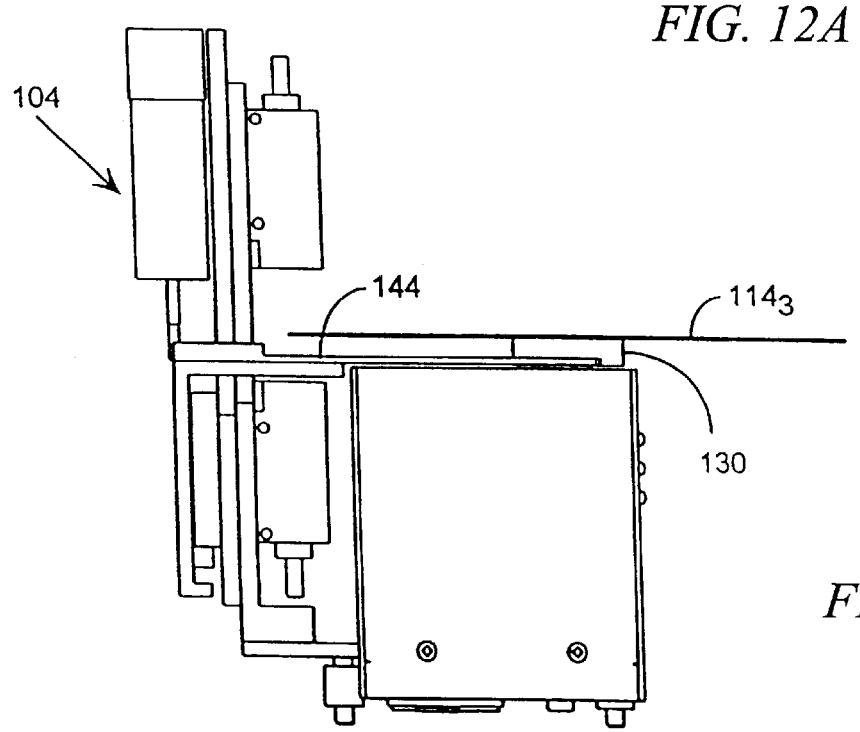
FIG. 12B is a side view of the aligner shown in FIG. 12A.

It can be seen that the position of aligner 104 in FIGS. 12A and 12B is identical to that of the aligner shown in FIGS. 7A and 7B. The aligner continues to cycle through each of the positions shown in FIGS. 7A–11B until each of the wafers 114 within cassette 112 have been processed.

By providing a buffer mechanism including buffer paddle 144 on aligner 104, the throughput of aligner 104 may be significantly improved relative to conventional aligners. The buffer mechanism allows the robot to bring a second wafer to the aligner while a first wafer is processed, and then allows the robot to carry the first wafer away from the aligner while the second wafer is processed. Thus, the aligner does not sit idle while the robot transfers wafers to and from the aligner. In one embodiment of the invention, the aligner 104 is capable of processing approximately 500 wafers per hour. This represents an increase in throughput of roughly 67% over conventional aligners.

In the preferred embodiment described above, buffer paddle 144 lifts a processed wafer 114 straight upward off chuck 130. However, it is understood in alternative embodiments of the invention that buffer paddle 144 may include an additional translating or rotating mechanism so that after the buffer paddle 144 moves upward to lift a wafer 114 off chuck 130, the buffer paddle may then move off to a side of the chuck 130. As would be appreciated by those of skill in the art, the buffer paddle may be mounted to various linear or rotational drives, which are in turn mounted to drive 146, to accomplish the additional translating and/or rotating according to this embodiment.

Up to this point, aligner 104 has been described as including a single chuck 130. However, in an alternative embodiment shown in FIGS. 13A–13D, aligner 104 may in fact comprise a pair of aligner modules $104_1$ and $104_2$, each of which modules operating as aligner 104 described above so as to be capable of performing radial runout determination, notch finding and OCR mark reading simultaneously on a pair of wafers (the buffer paddles 144 on each module 104 has been omitted from FIGS. 13A–13D for clarity). In such an embodiment, the pair of aligner modules $104_1$ and $104_2$ may be located side by side to each other so that wafers 114 processed thereon overlap each other as shown in FIG. 13B. Alternatively, the pair of aligners may be spaced from each other to occupy non-overlapping footprints. Where the wafers overlap each other, the chuck 130 supporting the upper wafer may be supported on an arm 168 extending in over the chuck 130 supporting the lower wafer. The arm 168 is positioned at a height so as to create a space 170 therebelow where the above-described vertical translation of the buffer paddle 144 on aligner module $104_1$ can take place without interference from the arm 168. The embodiment shown in FIGS. 13A–13D optimally operates with either a pair of robots 102 or a dual arm robot 102 to take advantage of the higher throughput provided by the dual aligner configuration.

While the present invention described above relates to a system for increasing the throughput of an aligner, it is understood that the system of the present invention may be used on other process tools to increase throughput. In such embodiments, where a wafer is transferred from an end effector of a robot onto a support platform (rotating or otherwise) of the process tool, a buffer paddle as described above may mounted adjacent thereto to provide a buffer location at the support platform on which wafers may be buffered before or after processing on the tool, thereby improving the throughput of the tool.

Although the invention has been described in detail herein, it should be understood that the invention is not limited to the embodiments herein disclosed. Various changes, substitutions and modifications may be made thereto by those skilled in the art without departing from the spirt or scope of the invention as described and defined by the appended claims.

We claim:

1. An aligner for aligning workpieces transferred to and from the aligner by a robot having an end effector, comprising:

a rotating support platform, for supporting and rotating a first workpiece; and a buffer paddle, adapted to move wafers independently of the robot in a Z-direction and to directly exchange a workpiece with the end effector of the robot, adapted to store a second workpiece above said rotating support platform while the first workpiece is being supported and/or rotated on said rotating support platform, and for placing a second workpiece on said rotating support platform after the robot removes the first workpiece from said rotating support platform.

2. An apparatus for determining radial runout of, and/or for reading an indicial mark on, workpieces, comprising:

a rotating support platform for supporting and rotating the workpiece; and a buffer mechanism proximate to said rotating support platform, including:

a support surface; and a drive mechanism mechanically affixed to said support surface, for vertically translating said support surface to acquire the workpiece from said rotating support platform, and to seat the workpiece on said rotating support platform; and a robot having an end effector, for transferring a workpiece directly between said support surface of said buffer mechanism and said end effector, and for transferring a workpiece between said rotating support platform and said end effector.

3. An aligner as recited in claim 2, wherein the workpiece comprises a semiconductor wafer.

4. An aligner as recited in claim 2, further comprising an analog sensor system for determining the radial runout of the workpiece as the workpiece is rotating on said support platform.

5. An aligner for determining radial runout of, and/or for reading an indicial mark on, workpieces transferred to and from the aligner by a robot having an end effector, comprising:

a rotating support platform for supporting and rotating a first workpiece; and a buffer paddle, adapted to exchange a workpiece directly with the end effector of the robot, to store a second workpiece while the first workpiece is being supported and/or rotated by said rotating support platform, and to place the second workpiece on said rotating support platform after the robot removes the first workpiece from said rotating support platform.

6. An aligner as recited in claim 5, wherein said workpiece comprises a semiconductor wafer.

7. An aligner as recited in claim 5, further including a second drive for horizontally translating said buffer paddle.

8. An aligner as recited in claim 5, wherein said support platform comprises a chuck for supporting a back surface of the workpiece.

9. An aligner as recited in claim 5, wherein said support platform has a low pressure communicated thereto to hold the workpiece thereon.

10. An aligner as recited in claim 5, wherein said support platform comprises a plurality of edge grips for supporting the workpiece around an outer edge of the workpiece.

11. An aligner as recited in claim 5, wherein said buffer paddle has a low pressure communicated thereto to hold the workpiece thereon.

12. An aligner as recited in claim 5, further comprising a drive mechanism for vertically translating said buffer paddle.

13. An aligner as recited in claim 12, said drive mechanism capable of translating said buffer paddle upward to acquire the workpiece from said support platform, and said drive mechanism capable of translating said buffer paddle downward to locate the workpiece on said support platform.

14. An aligner as recited in claim 5, further comprising an analog sensor system for determining the radial runout of the workpiece as the workpiece is rotating on said support platform.

15. An aligner as recited in claim 14, said analog sensor system including a transmitter for transmitting a first quantity of light, and a receiver for receiving a second quantity of light which is some portion of said first quantity of light, said second quantity of light being that portion of said first quantity of light that is not blocked by the workpiece, said sensor system making an analog measurement of said second quantity of light.

* * * * *